United States Patent [19]
Jostins et al.

[11] Patent Number: 5,459,791
[45] Date of Patent: Oct. 17, 1995

[54] AUDIO FREQUENCY FILTER

[75] Inventors: Peter Jostins, London; John R. Stadius, Oxshott, both of United Kingdom

[73] Assignee: Soundtracs PLC, Surrey, United Kingdom

[21] Appl. No.: 92,597

[22] Filed: Jul. 16, 1993

[51] Int. Cl.⁶ .................................................. H03G 9/00
[52] U.S. Cl. ................................... 381/102; 333/28 T
[58] Field of Search ......................... 381/98, 102, 101; 333/28 T

[56] References Cited

U.S. PATENT DOCUMENTS

| 3,700,811 | 10/1972 | Davidson | 333/28 T |
| 4,168,472 | 9/1979 | Sugimoto | 330/278 |

FOREIGN PATENT DOCUMENTS

| 1517056 | 7/1978 | United Kingdom | H03H 9/32 |
| 2189100A | 10/1987 | United Kingdom | H03G 5/00 |
| WO87/06074 | 10/1987 | WIPO | H03H 11/12 |

Primary Examiner—Forester W. Isen
Attorney, Agent, or Firm—Needle & Rosenberg

[57] ABSTRACT

An audio frequency filter for a mixing console equalizer typically has a manual frequency control for setting its operating frequency range, and a manual gain control for controlling the gain of the filter independently of the set frequency range. The present filter further provides gain adjustment means for automatically adjusting the gain of the filter in dependence on the position of said operating frequency range relative to a reference frequency that lies intermediate the lower and upper ends of the audio frequency spectrum, the gain adjustment means being such that the filter gain is greater the further said operating frequency range is moved away from said reference frequency towards a said end of the audio spectrum. As a result, signal frequencies at the extreme of the audio spectrum are automatically boosted.

23 Claims, 5 Drawing Sheets

5,459,791

AUDIO FREQUENCY FILTER

The present invention relates to an audio frequency filter for use in particular, but not exclusively, in audio-frequency equalizers employed in professional mixing consoles.

Audio frequency equalizers such as used in mixing consoles generally include filters for boosting and/or attenuating particular portions of the audio frequency spectrum; thus, typically, an equalizer will include high and low frequency selective filters and one or more midband selective filters. Each filter generally has both a manual frequency control for adjusting the operating frequency range of the filter, and a manual gain control for setting the desired level of gain within the selected frequency range (the gain may be greater or less than unity - or, in terms of dBs, may be positive or negative—either boosting or attenuating signal frequencies).

In known equalizers, the filters are designed such that the gain set by the manual gain control is independent of the selected frequency range. This, of course, would seem the desirable way to proceed as users do not have to concern themselves with interaction between gain and frequency settings. However, in the real world, such interaction does exist in as much as the frequency response of the human ear drops off at both extremes of the audio frequency spectrum.

It is an object of the invention to provide an improved audio-frequency filter that provides a natural linkage between gain and frequency.

According to one aspect of the present invention, there is provided an audio frequency filter having an operating frequency range within which the filter is operative to boost and/or attenuate an input signal, the filter having:

—externally-settable frequency control means for adjusting the position of the operating frequency range of the filter, and —gain adjustment means for automatically adjusting the magnitude of the gain of the filter, whether a positive gain for boosting the input signal or a negative gain for attenuating the input signal, in dependence on the position of said operating frequency range relative to a reference frequency that lies intermediate the lower and upper ends of the audio frequency spectrum, the gain adjustment means being such that the magnitude of the filter gain is greater the further said operating frequency range is moved away from said reference frequency towards a said end of the audio spectrum.

With a filter of this form, the filter gain is automatically increased as the operating frequency range of the filter is moved towards one or other end of the audio spectrum. This automatic compensation is advantageous, for example, where the filter forms part of an equalizer for a recording-studio mixing console as it compensates both for the reduced responsiveness of the human ear at extremes of the audio spectrum and for the generally reduced audio power levels of natural music at such extremes.

When used in an equalizer for a mixing console, the filter will generally also be provided with a manual gain control as well as the aforesaid automatic gain adjustment means.

The gain control effected by said gain adjustment means will generally not require said reference frequency to be explicitly defined; instead, this frequency will normally be inherent in the design of the filter.

The said frequency control means may adjust the position of the operating frequency range of the filter by adjusting one limit of this range (as, for example, where the filter is a low frequency or high frequency filter) or may adjust both limits of the range (as, for example, where the filter is a band-selective filter); in both cases, there will be an effective shift in the overall position of the range.

Where the filter is a low-frequency filter with its operating frequency range positioned towards the low-frequency side of said reference frequency, the frequency control means is arranged to vary the upper frequency bound of said operating range and said gain adjustment means is arranged to increase the magnitude of the gain of the filter as said upper frequency bound is reduced. Conversely, where the filter is a high-frequency filter with its operating frequency range positioned towards the high-frequency side of said reference frequency, the frequency control means is arranged to vary the lower frequency bound of said operating range and said gain adjustment means is arranged to increase the magnitude of the gain of the filter as said lower frequency bound is increased. Where the filter is a band-selective filter, its operating frequency range will generally be selectively positionable, by the frequency control means, to lie on either side of said reference frequency, the gain adjustment means being arranged to increase the magnitude of the gain of the filter as the operating frequency range is moved away from said reference frequency.

Preferably, the frequency control means comprises a network including a feedback amplifier with respective potentiometers connected into the forward and feedback paths of the amplifier, the potentiometers being coupled for joint manual operation to adjust the frequency response characteristics of the network. In this case, the gain adjustment means advantageously comprises means setting the resistances in said forward and feedback paths such that the ratio of resistances in these two paths changes as the setting of the potentiometers changes.

Filters embodying the invention may be incorporated into an audio-frequency equalizer. Thus, for example, an equalizer may include both a low-frequency filter and a high-frequency filter embodying the invention, it being appreciated that the generally notional reference frequencies of the two filters will normally be independent of each other.

According to another aspect of the present invention, there is provided a filter comprising means for setting the operating frequency range of the filter, and means for automatically adjusting the gain of the filter in dependence on the set operating frequency range of the filter.

Filters embodying the invention will now be particularly described, by way of nonlimiting example, with reference to the accompanying diagrammatic drawings, in which:

FIG. 3 is a graph showing the change in the gain/frequency response of the

Figure 2:
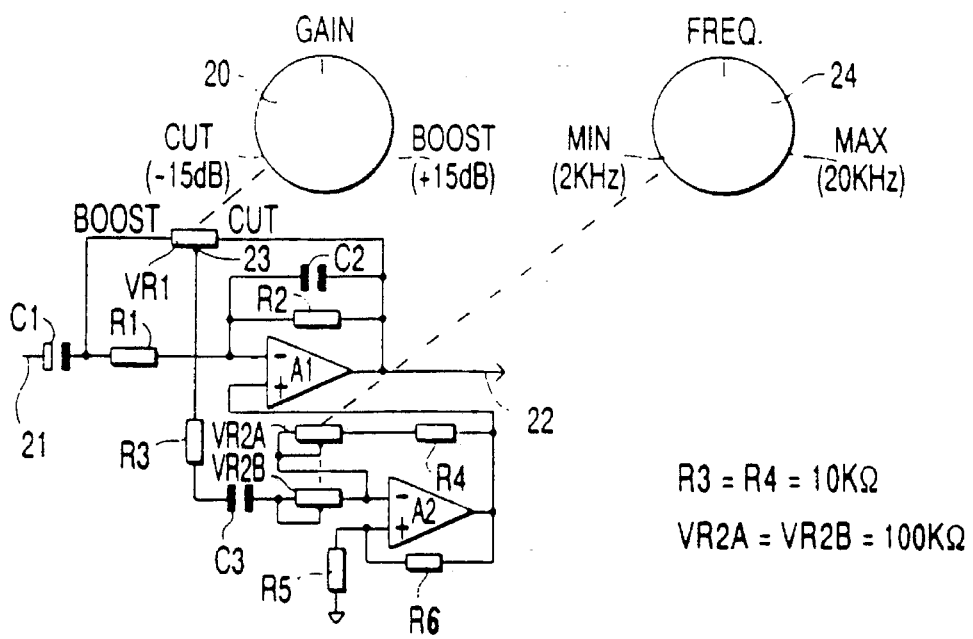
FIG. 2 is a circuit diagram of a known form of high-frequency equalizer filter.
Figure 4:
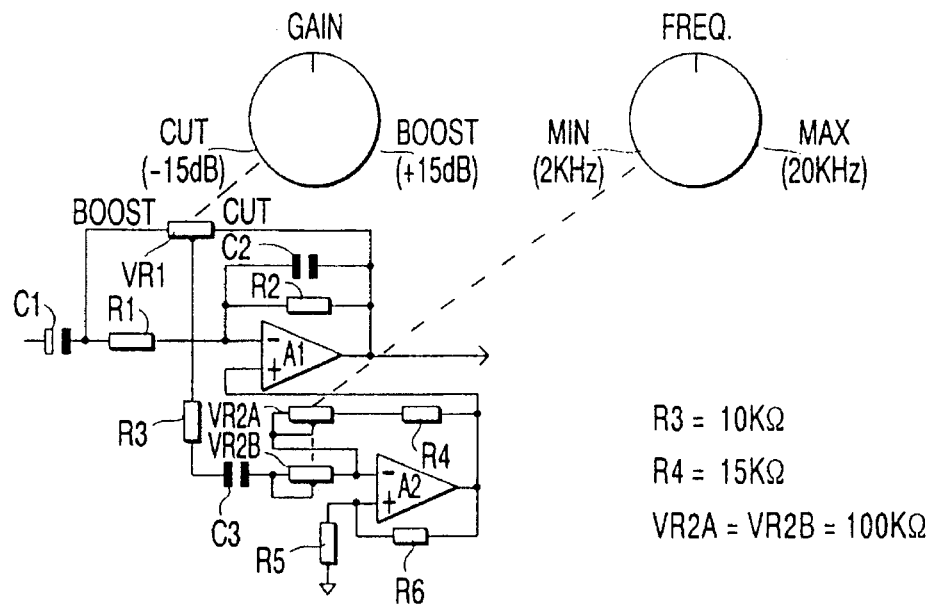
Figure 5:
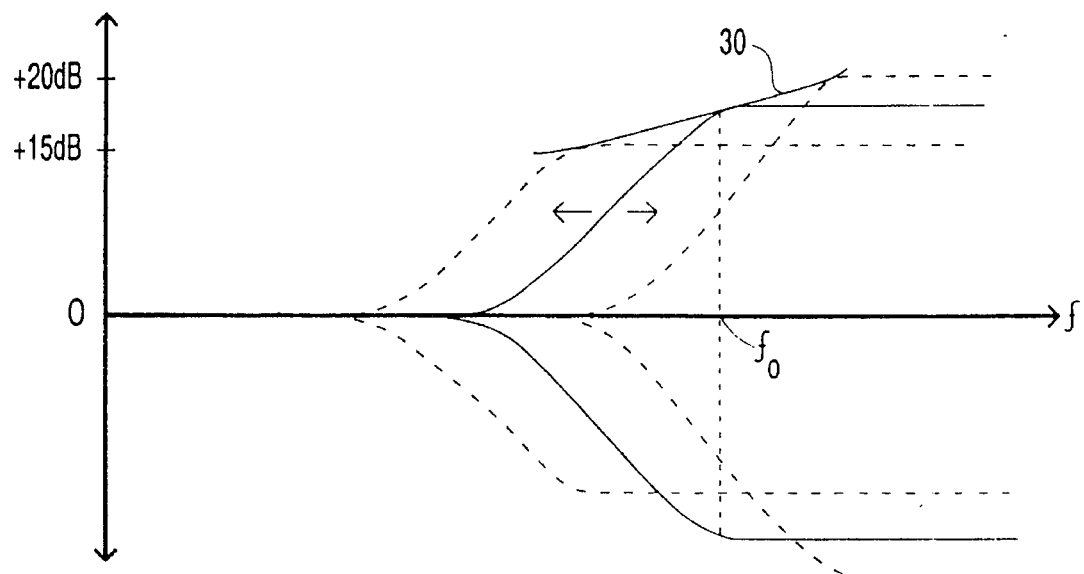

FIG. 2 circuit as the operating frequency range of the circuit is varied;

FIG. 4 is a circuit diagram of a high-frequency filter embodying the invention;

FIG. 5 is a graph showing the change in the gain/frequency response of the

Figure 6:
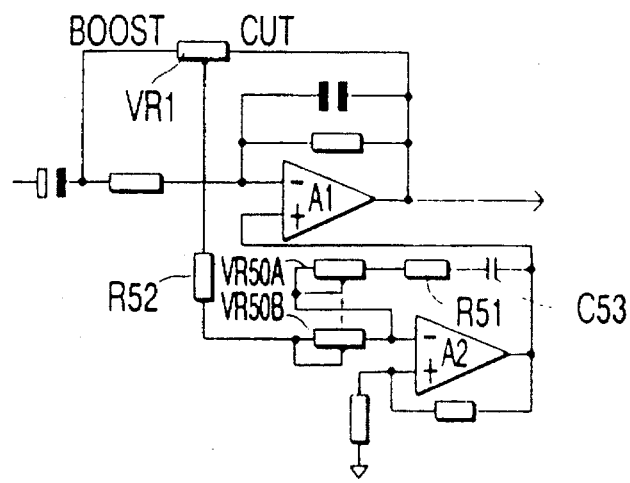
Figure 7:
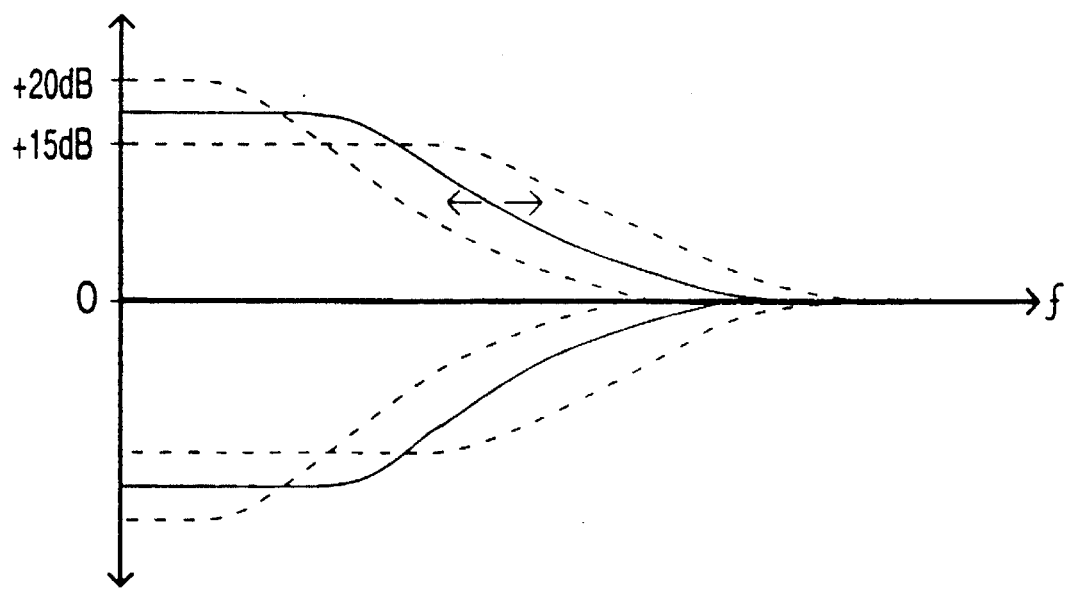

FIG. 4 circuit as the operating frequency range of the circuit is varied;

FIG. 6 is a circuit diagram of a low-frequency filter embodying the invention; and FIG. 7 is a graph showing the change in the gain/frequency response of the FIG. 6 circuit as the operating frequency range of the circuit is varied.

Figure 8:
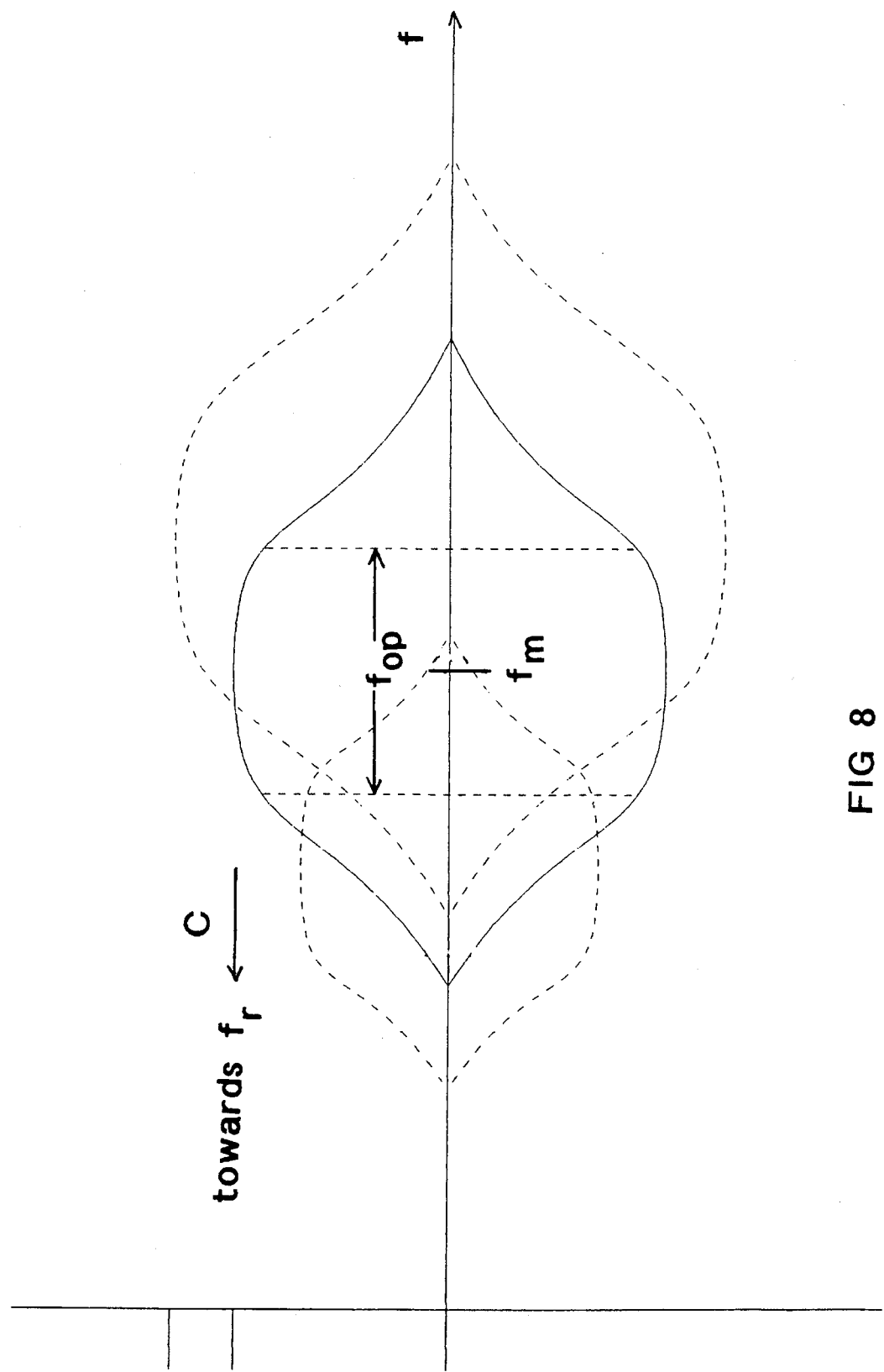

FIG. 8 is a graph illustrating filter gain as the mid frequency of the operating band of a band-selective filter moves away from a particular frequency.

Figure 1:
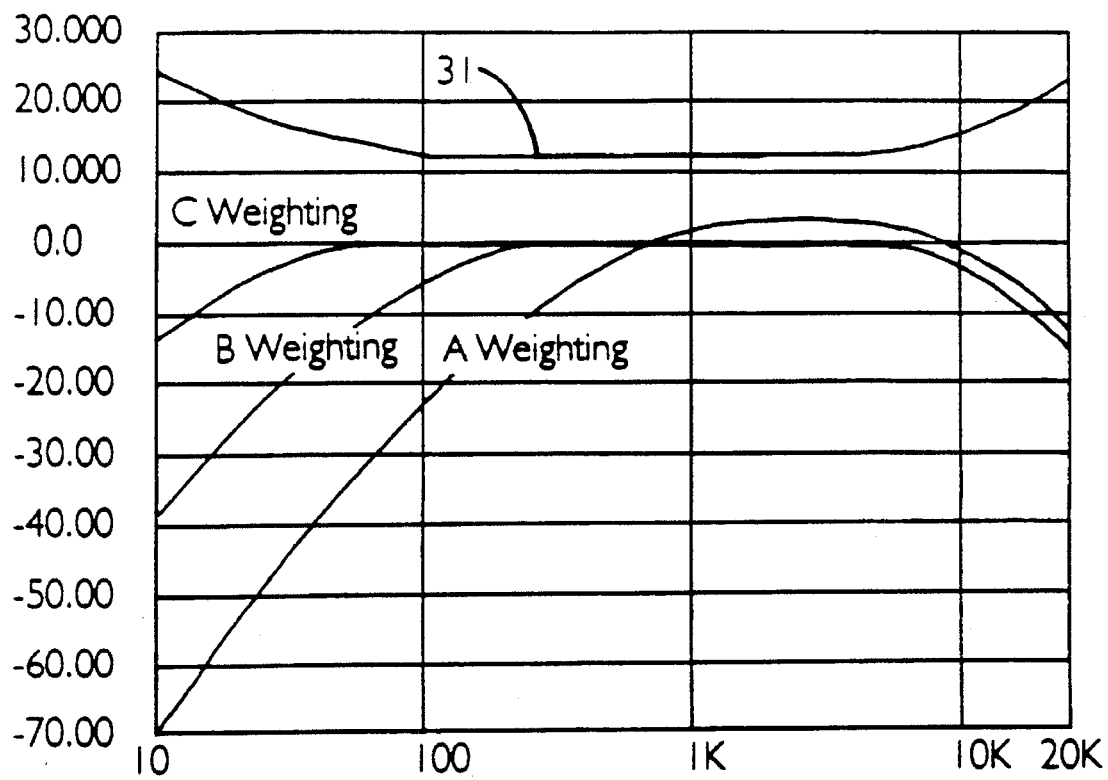
FIG. 1 is a graph showing frequency response curves of the human ear.

FIG. 1 shows the so-called A, B and C weighting curves that represent the frequency response characteristics of the human ear at different sound pressure levels, curve A being for the lowest level. As can be seen, human hearing drops off significantly at high and low frequencies. The same is also true of the power levels of naturally occuring music.

FIG. 2 shows a known high-frequency filter used in an audio frequency equalizer. The filter is built around two operational amplifiers A1 and A2. A filter input signal on line 21 is fed via capacitor C1 and resistor R1 to the inverting input of the amplifier A1 and the resultant amplifier output is provided on line 22. Feedback is provided from the amplifier output to its input via resistor R2 and capacitor C2 in parallel. In addition, the track of potentiometer VR1 (typically, 10 Kohms) is connected between the output line 22 and the junction of capacitor C1 and resistor R1. A signal tapped off from the slider 23 of the potentiometer VR1 is provided to the non-inverting input of the amplifier A1 after modification in a frequency-sensitive network including the amplifier A2.

If the frequency-dependent characteristics of the network including amplifier A2 are ignored, then the signal tapped off from the slider 23 of the potentiometer VR1 can be considered as simply inverted by amplifier A2 before being applied to the non-inverting input of amplifier A1. As a result, when the slider 23 of potentiometer VR1 is fully to the left (as viewed in figure), the signal applied to the amplifier A2 is substantially the filter input signal so that after inversion by amplifier A2 and feeding to the non-inverting input of amplifier A1, it will be added to the signal applied to the inverting input of amplifier A1 resulting in a large overall positive gain of typically 15 dB. In contrast, when the slider 23 is in its rightmost position, the signal applied to the amplifier A2 is the output signal on line 22 so that after inversion by amplifier A2 and feeding to the non-inverting input of amplifier A1, it will be subtracted from the signal applied to the inverting input of amplifier A1 resulting in a large overall negative gain of typically −15 dB. Between these two extreme positions of the potentiometer slider 23, operation of the potentiometer is effective to smoothly vary the overall gain of the amplifier.

Considering now the form of the network that includes the amplifier A2, this network comprises, in addition to the amplifier A2, resistors R3 to R6, capacitor C3 and a ganged pair of potentiometers VR2A and VR2B manually operable by means of knob 24. Resistor R3 and potentiometer VR2A are connected in series between the slider 23 of the potentiometer VR1 and the inverting input of amplifier A2 (the forward path of the amplifier) whilst the resistor R4 and potentiometer VR2B are connected in a feedback path of amplifier A2. The values of R3 and R4 are the same (typically 10 Kohms) and the values of potentiometers VR2A and VR2B are also the same (typically, 100 Kohms), these potentiometers being connected to produce corresponding variations in resistance in the paths in which they are connected. It will be appreciated that regardless of the settings of the the ganged potentiometers VR2A and VR2B, the resistance in the forward and feedback paths of the amplifier A2 will be the same so that, absent any frequency dependent effects in the network, the gain of the amplifier A2 is constant at unity.

Figure 3:
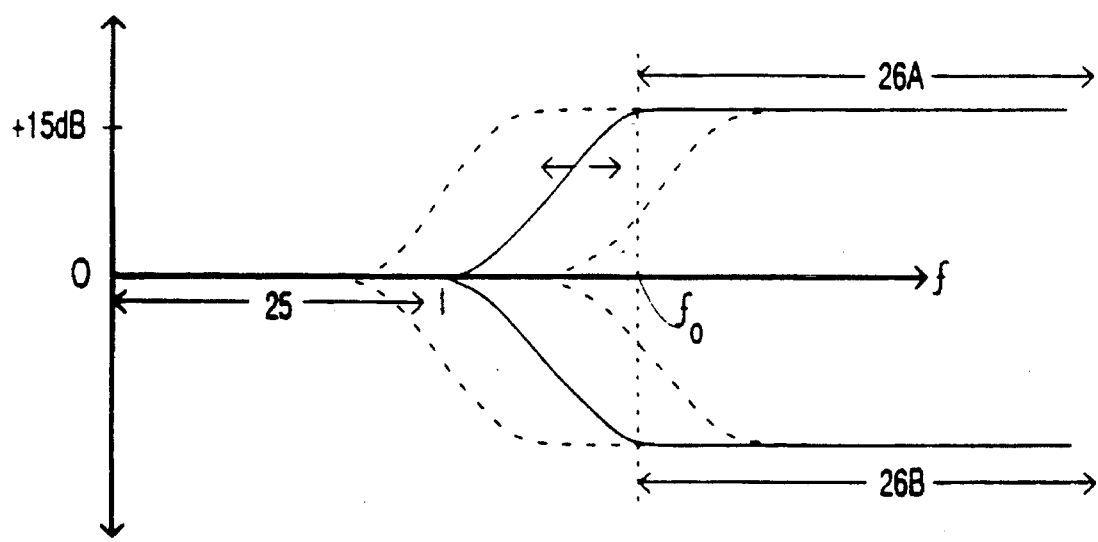

The frequency-sensitive characteristics of the network including amplifier A2 arise due to the presence of the capacitor C3 which typically has a value of 1 nF. More particularly, at low frequencies the capacitor blocks the signal from the slider 23 of potentiometer VR1 with the result that a constant voltage is applied to the non-inverting input of the amplifier A1 from the output of amplifier A2; this, in turn, results in the filter input signal undergoing a fixed amplification (typically 0dB) as it passes from line 21 to line 22 via amplifier A1 with the setting of the potentiometer VR1 having no effect. This low frequency behavior is represented in the frequency/gain graph of FIG. 3 by portion 25. At high frequencies, the impedance presented by capacitor C3 is negligible so that the signal from the slider of potentiometer VR1 undergoes inversion in amplifier A2 before being fed to amplifier A1 to modify the gain of this amplifier in dependence on the setting of potentiometer VR1 in the manner already described. This behavior corresponds to portions 26A and 26B of the frequency/gain graph of FIG. 3 where portion 26A relates to settings of VR1 for boosting the input signal (that is, positive gain settings) and portion 26B relates to settings of VR1 for cutting the input signal (that is, negative gain settings). The transition between the two behaviours represented by portions 25 and 26 of FIG. 3 occurs over a relatively narrow frequency band which, for convenience, will be referenced by the frequency $f_0$ at which the gain of the filter flattens out to its level set by potentiometer VR1. In fact, as illustrated in FIG. 3, the transition region is not fixed but can be varied, this variation being brought about by adjusting the setting of the potentiometers VR2A and VR2B to vary the resistances in the frequency-sensitive network of which the capacitor C3 forms a part. Thus, at the maximum setting of the potentiometers VR2A and VR2B, the transition frequency $f_0$ may be 2 KHz, whilst at the minimum setting, the transition frequency $f_0$ may be 20 KHz. Varying the setting of the potentiometers VR2A and VR2B thus adjusts the operating frequency range of the filter, this range being from the frequency $f_0$ upwards. As already indicated, within the operating frequency range of the filter, the filter gain is independent of the setting of potentiometers VR2A and VR2B.

It will be appreciated that when the FIG. 2 high-frequency selective filter is used in a mixing console equalizer, adjustment of the operating frequency band to select only higher frequencies is not accompanied by any substantial variation in gain within the operating frequency band. As a result, for the reasons already explained with reference to FIG. 1, it is often necessary for the user to compensate for a perceived drop in sound level by adjusting the gain control knob 20 of the filter to increase the filter gain; this can be extremely inconvenient when setting up a large mixing console where many channels may need adjustment.

FIG. 4 shows the high-frequency filter embodying the present invention. The filter circuit is of substantially the same form as that shown in FIG. 2 and operates in the same general manner. However, in the FIG. 4 circuit the values of resistors R3 and R4 are made different; for example, resistor R3 has a value of 10 Kohms whilst resistor R4 has a value of 15 kohms. As a result, the ratio of the resistances in the forward and feedback paths of the amplifier A2 will no longer be constant but will vary in dependence on the setting of potentiometers VR2A and VR2B—that is, in dependence on the position of the operating frequency range ($f_0$ upwards) of the filter. More particularly, this ratio will vary between (100k+15k):(100k+10k) and (15 k):(10 k)-that is, between substantially unity and 3:2. This variation translates into a variation of the gain of amplifier A2 and, in turn, a variation in the gain of the filter as its operating frequency range is adjusted; the overall arrangement is such that as the in-circuit resistance of the potentiometers VR2A and VR2B is decreased to increase the value of the frequency $f_0$, the gain of amplifier A2 and thus of the filter as a whole, will increase within the filters operating frequency range. FIG. 5 shows the frequency/gain characteristic of the FIG. 4 circuit and is similar to FIG. 3 but now it will be seen that for each different curve plotted (each corresponding to a particular setting of the potentiometers VR2A and VR2B), the gain of the filter in its operating region is different, the gain (whether positive or negative) increasing in magnitude with increasing values of the frequency $f_0$. Line 30 in FIG. 5 plots the filter gain as a function of the frequency $f_0$.

The same principles can, of course, be applied to low-frequency selective filters. Thus, for example, FIG. 6 shows the circuitry of a low frequency selective filter embodying the present invention. This circuitry is similar to that of FIGS. 2 and 4 being built around two op amps A1 and A2 and including a gain adjustment potentiometer VR1. The frequency sensitive network built around op amp A2 now, however, includes a capacitor C3 in the input path of the circuitry of FIGS. 2 and 4. The effect of this is to change the circuitry from a high-frequency to a low-frequency filter. The upper operating frequency of the FIG. 6 circuitry is adjustable by a pair of ganged, equal-valued, potentiometers VR50A, VR50B. Resistors R51 and R52 in series with the potentiometers VR50A, VR50B respectively, are given different values and accordingly act in the same manner as the resistors R3 and R4 of FIG. 4 to give different gains to the circuitry depending on the setting of the frequency-controlling potentiometers VR50A, VR50B. The gain/frequency response of the FIG. 6 circuitry is shown in FIG. 7 and, as can be seen, it is substantially a mirror image of that shown in FIG. 5—that is, the gain of the filter increases as the frequency at which the low-frequency operating range starts is reduced.

The principle described above can also be applied to band-selective filters, the operating frequency band $f_{op}$ which, as illustrated in FIG. 8, can be swept over a substantial part of the audio range. In this case, the filter gain can be set to increase as the mid frequency fm of the operating band $f_{op}$ moves away from some particular frequency, which, in FIG. 8, is a frequency in the direction indicated by arrow C, whether this movement be up or down in frequency (indeed, the high-frequency and low-frequency filters can also be considered to act in the same general manner relative to some notional frequency but with the difference that their operating frequency ranges are only movable on one side of this notional frequency fr, as shown in FIGS. 5 and 7.

An audio-frequency equalizer incorporating high and low frequency filters embodying the invention may exhibit a frequency/gain characteristic such as represented by line 31 in FIG. 1.

What is claimed is:

1. An audio frequency filter having an operating frequency range within which the filter is operative to boost and/or attenuate an input signal and outside of which the input signal undergoes substantially a fixed amplification, the filter having:

frequency control means for adjusting the position of its operating frequency range; and gain adjustment means for automatically adjusting the magnitude of the gain of the filter, whether a positive gain for boosting the input signal or a negative gain for attenuating the input signal, in dependence on the position of said operating frequency range relative to a reference frequency that lies intermediate the lower and upper ends of the audio frequency spectrum and in the case of high frequency and low frequency selective filters outside the operating frequency range of the filters, the gain adjustment means being such that the magnitude of the filter gain is greater the further said operating frequency range is moved away from said reference frequency towards a said end of the audio spectrum.

2. A filter according to claim 1, further comprising gain control means for varying the gain of the filter within its said operating frequency range.

3. A filter according to claim 1, wherein said frequency control means comprises a network for modifying the transfer characteristics of the filter, the network including an amplifier with feedback that has respective potentiometers connected into its forward and feedback paths, the potentiometers being coupled for joint manual operation to adjust the frequency response characteristics of the network; said gain adjustment means comprising means for varying the gain of said network in dependence on the setting of the potentiometers.

4. A filter according to claim 3, wherein the gain adjustment means comprises means for setting the resistances in said forward and feedback paths such that the ratio of resistances in these two paths changes as the setting of the potentiometers changes whereby to vary the gain of said network.

5. A filter according to claim 4, wherein the ratio of maximum to minimum gains of said network that occur as the position of the operating frequency range is varied over its full extent by said frequency control means, is at least 6:5.

6. A filter according to claim 5, wherein said ratio is substantially 3:2.

7. A filter according to claim 1, wherein the filter is a low frequency filter with its operating frequency range positioned towards the low frequency side of said reference frequency, the frequency control means being operative to vary the upper frequency bound of said operating range and said gain adjustment means being operative to increase the magnitude of the gain of the filter as said upper frequency bound is reduced.

8. A filter according to claim 1, wherein the filter is a high frequency filter with its operating frequency range positioned towards the high frequency side of said reference frequency, the frequency control means being operative to vary the lower frequency bound of said operating range and said gain adjustment means being operative to increase the magnitude of the gain of the filter as said lower frequency bound is increased.

9. A filter according to claim 1, wherein the filter is a band-selective filter the operating frequency range of which is selectively positionable by the frequency control means to lie on either side of said reference frequency, the said gain adjustment means being operative to increase the magnitude of the gain of the filter as the operating frequency range is moved away from said reference frequency.

10. An equalizer comprising a plurality of filters, said filters having an operating frequency range within which the filter is operative to boost and/or attenuate an input signal and outside of which the input signal undergoes substantially a fixed amplification; wherein said filters comprise:

a. frequency control means for adjusting the position of its operating frequency range; and b. gain adjustment means for automatically adjusting the magnitude of the gain of the filter, whether a positive gain for boosting the input signal or a negative gain for attenuating the input signal, in dependence on the position of said operating frequency range relative to a reference frequency that lies intermediate the lower and upper ends of the audio frequency spectrum and in the case of high frequency and low frequency selective filters outside the operating frequency range of the filters, the gain adjustment means being such that the magnitude of the filter gain is greater the further said operating frequency range is moved away from said reference frequency towards a said end of the audio spectrum.

11. The equalizer of claim 10 comprising a low-frequency filter wherein the filter has its operating frequency range positioned towards the low frequency side of said reference frequency, the frequency control means being operative to vary the upper frequency bound of said operating range and said gain adjustment means being operative to increase the magnitude of the gain of the filter as said upper frequency bound is reduced.

12. The equalizer of claim 10 comprising a high-frequency filter wherein the filter has its operating frequency range positioned towards the high frequency side of said reference frequency, the frequency control means being operative to vary the lower frequency bound of said operating range and said gain adjustment means being operative to increase the magnitude of the gain of the filter as said lower frequency bound is increased.

13. An audio frequency filter having an operating frequency range within which the filter is operative to boost and/or attenuate an input signal and outside of which the input signal undergoes substantially a fixed amplification, the filter having:

frequency control means for adjusting the position of its operating frequency range;

gain adjustment means for automatically adjusting the magnitude of the gain of the filter, whether a positive gain for boosting the input signal or a negative gain for attenuating the input signal, in dependence on the position of said operating frequency range relative to a reference frequency that lies intermediate the lower and upper ends of the audio frequency spectrum and in the case of high frequency and low frequency selective filters outside the operating frequency range of the filters, the gain adjustment means being such that the magnitude of the filter gain is greater the further said operating frequency range is moved away from said reference frequency towards a said end of the audio spectrum; and wherein said frequency control means comprises a network for modifying the transfer characteristics of the filter, the network including an amplifier with feedback that has respective potentiometers connected into its forward and feedback paths, the potentiometers being coupled for joint manual operation to adjust the frequency response characteristics of the network; said gain adjustment means comprising means for varying the gain of said network in dependence on the setting of the potentiometers.

14. A filter according to claim 13, wherein the gain adjustment means comprises means for setting the resistances in said forward and feedback paths such that the ratio of resistances in these two paths changes as the setting of the potentiometers changes to vary the gain of said network.

15. A filter according to claim 14, wherein the ratio of maximum to minimum gains of said network that occur as the position of the operating frequency range is varied over its full extent by said frequency control means, is at least 6:5.

16. A filter according to claim 15, wherein said ratio is substantially 3:2.

17. A filter according to claim 13, wherein the filter is a low frequency filter with its operating frequency range positioned towards the low frequency side of said reference frequency, the frequency control means being operative to vary the upper frequency bound of said operating range and said gain adjustment means being operative to increase the magnitude of the gain of the filter as said upper frequency bound is reduced.

18. A filter according to claim 13, wherein the filter is a high frequency filter with its operating frequency range positioned towards the high frequency side of said reference frequency, the frequency control means being operative to vary the lower frequency bound of said operating range and said gain adjustment means being operative to increase the magnitude of the gain of the filter as said lower frequency bound is increased.

19. A filter according to claim 13, wherein the filter is a ban&selective filter, the operating frequency range of which is selectively positionable by the frequency control means to lie on either side of said reference frequency, said gain adjustment means being operative to increase the magnitude of the gain of the filter as the operating frequency range is moved away from said reference frequency.

20. A filter according to claim 13, further comprising gain control means for varying the gain of the filter within its said operating frequency range.

21. An equalizer comprising a plurality of filters, said filters having an operating frequency range within which the filter is operative to boost and/or attenuate an input signal and outside of which the input signal undergoes substantially a fixed amplification wherein said filters comprise:

—frequency control means for adjusting the position of its operating frequency range and outside of which the input signal undergoes substantially a fixed amplification;

—gain adjustment means for automatically adjusting the magnitude of the gain of the filter, whether a positive gain for boosting the input signal or a negative gain for attenuating the input signal, in dependence on the position of said operating frequency range relative to a reference frequency that lies intermediate the lower and upper ends of the audio frequency spectrum and in the case of high frequency and low frequency selective filters outside the operating frequency range of the filters, the gain adjustment means being such that the magnitude of the filter gain is greater the further said operating frequency range is moved away from said reference frequency towards a said end of the audio spectrum; and —said frequency control means comprises a network for modifying the transfer characteristics of the filter, the network including an amplifier with feedback that has respective potentiometers connected into its forward and feedback paths, the potentiometers being coupled for joint manual operation to adjust the frequency response characteristics of the network; said gain adjustment means comprising means for varying the gain of said network in dependence on the setting of the potentiometers.

22. The equalizer of claim 21 comprising a low-frequency filter wherein the filter has its operating frequency range positioned towards the low frequency side of said reference frequency, the frequency control means being operative to vary the upper frequency bound of said operating range and said gain adjustment means being operative to increase the magnitude of the gain of the filter as said upper frequency bound is reduced.

23. The equalizer of claim 21 comprising a high-frequency filter wherein the filter has its operating frequency range positioned towards the high frequency side of said reference frequency, the frequency control means being operative to vary the lower frequency bound of said operating range and said gain adjustment means being operative to increase the magnitude of the gain of the filter as said lower frequency bound is increased.

* * * * *